(12) United States Patent
Lu et al.

(10) Patent No.: US 12,345,763 B2
(45) Date of Patent: Jul. 1, 2025

(54) COMPARATOR TESTING CIRCUIT AND TESTING METHOD THEREOF

(71) Applicant: Nuvoton Technology Corporation, Hsinchu (TW)

(72) Inventors: Chih-Ping Lu, Hsinchu (TW); Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 105 days.

(21) Appl. No.: 18/473,299

(22) Filed: Sep. 25, 2023

(65) Prior Publication Data

US 2024/0110977 A1 Apr. 4, 2024

(30) Foreign Application Priority Data

Sep. 30, 2022 (TW) .................................. 111137140

(51) Int. Cl.
  *H03K 5/24* (2006.01)
  *G01R 31/3177* (2006.01)
  *H03K 3/037* (2006.01)
  *H03K 19/20* (2006.01)

(52) U.S. Cl.
  CPC .......... *G01R 31/3177* (2013.01); *H03K 3/037* (2013.01); *H03K 5/24* (2013.01); *H03K 19/20* (2013.01)

(58) Field of Classification Search
  None
  See application file for complete search history.

(56) References Cited

U.S. PATENT DOCUMENTS

| | | | |
|---|---|---|---|
| 8,320,087 B2 | 11/2012 | Lin | |
| 12,158,497 B2* | 12/2024 | Nam | G01R 31/31724 |
| 2009/0027925 A1 | 1/2009 | Kanouda et al. | |
| 2009/0278562 A1* | 11/2009 | Zaitsu | G01R 31/31924 324/762.01 |
| 2012/0306540 A1* | 12/2012 | Komatsu | H03K 19/00361 327/77 |
| 2013/0176033 A1* | 7/2013 | Chen | G01R 19/16542 324/433 |
| 2013/0234743 A1 | 9/2013 | Ren et al. | |
| 2022/0381807 A1* | 12/2022 | Yoo | G01R 19/16552 |

FOREIGN PATENT DOCUMENTS

| | | |
|---|---|---|
| CN | 107040249 | 1/2021 |
| TW | 200720658 | 6/2007 |
| TW | I383575 | 1/2013 |
| TW | M466413 | 11/2013 |
| TW | I650567 | 2/2019 |

* cited by examiner

*Primary Examiner* — Cassandra F Cox
(74) *Attorney, Agent, or Firm* — JCIPRNET (57) ABSTRACT

A comparator testing circuit and a testing method are provided. The comparator testing circuit includes a switching circuit, a comparator, and a determination circuit. The switching circuit receives a first signal, a second signal, and a switching signal, and outputs one of the first signal and the second signal as a first input signal and the other of the first signal and the second signal as a second input signal according to the switching signal. The comparator compares the first input signal with the second input signal to generate an output signal. The determination circuit determines whether the comparator is abnormal based on the switching signal and the output signal to generate an exception flag.

20 Claims, 8 Drawing Sheets

COMPARATOR TESTING CIRCUIT AND TESTING METHOD THEREOF

CROSS-REFERENCE TO RELATED APPLICATION

This application claims the priority benefit of Taiwan application serial no. 111137140, filed on Sep. 30, 2022. The entirety of the above-mentioned patent application is hereby incorporated by reference herein and made a part of this specification.

BACKGROUND OF THE INVENTION

Field of the Invention

The invention relates to a testing circuit, and more particularly, to a comparator testing circuit and a testing method thereof.

Description of Related Art

Traditionally, analog comparators have positive and negative analog voltage inputs and one digital output. The digital output may indicate that the voltage of the positive analog voltage input is higher or lower than the voltage of the negative analog voltage input. Generally speaking, analog comparators are fast and may be used to monitor the system for overvoltage or overcurrent. If there is an overvoltage or overcurrent condition in the system, the system may be notified immediately to activate the protection mechanism, or whether the input voltage reached the expected voltage may be learned via the input voltage at both ends as a reference for system control. Therefore, considering system safety, the analog comparator needs to have self-test function. However, since the analog comparator needs to meet the high response speed in applications, the self-test time should be as short as possible to avoid affecting the normal operation of the system.

SUMMARY OF THE INVENTION

The invention provides a comparator testing circuit and a testing method thereof used for self-test of a comparator to determine whether the comparator is abnormal.

An embodiment of the invention provides a comparator testing circuit. The comparator testing circuit includes a switching circuit, a comparator, and a determination circuit. The switching circuit receives a first signal, a second signal, and a switching signal, and outputs one of the first signal and the second signal as a first input signal and the other of the first signal and the second signal as a second input signal according to the switching signal. The comparator is coupled to the switching circuit and the comparator compares the first input signal with the second input signal to generate an output signal. The determination circuit is coupled to the switching circuit and the comparator and the determination circuit determines whether the comparator is abnormal based on the switching signal and the output signal to generate an exception flag.

An embodiment of the invention provides a testing method adapted for a comparator testing circuit, and the comparator testing circuit includes a switching circuit, a comparator, and a determination circuit. The testing method includes: receiving a first signal, a second signal, and a switching signal, and outputting one of the first signal and the second signal as a first input signal and the other of the first signal and the second signal as a second input signal according to the switching signal via the switching circuit; comparing the first input signal with the second input signal via the comparator to generate an output signal; and determining whether the comparator is abnormal based on the switching signal and the output signal via the determination circuit to generate an exception flag.

Based on the above, in some embodiments of the invention, by exchanging the input signals of the two input terminals in the comparator, whether the output signal of the comparator is different before and after the input signal is exchanged is determined, so as to know whether the comparator is abnormal. Since the comparator testing circuit may be completely implemented by a hardware circuit, self-test time may be shortened to avoid affecting system operations, and system reliability may be improved.

In order to make the aforementioned features and advantages of the disclosure more comprehensible, embodiments accompanied with figures are described in detail below.

DESCRIPTION OF THE EMBODIMENTS

The term "coupled to (or connected to)" used in the entire text of the specification of the present application (including claims) may refer to any direct or indirect connecting means. For example, if the text describes a first device is coupled to (or connected to) a second device, then it should be understood that the first device may be directly connected to the second device, or the first device may be indirectly connected to the second device via other devices or certain connecting means. Moreover, when applicable, elements/components/steps having the same reference numerals in figures and embodiments represent the same or similar parts. Elements/components/steps having the same reference numerals or having the same terminology in different embodiments may be cross-referenced.

Figure 1:
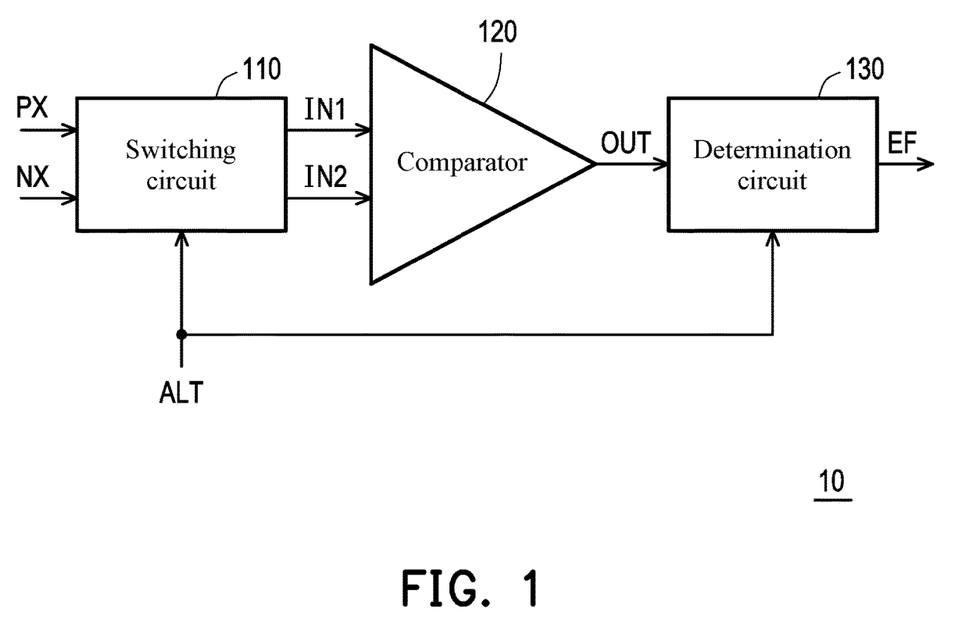
FIG. 1 is a block diagram of a comparator testing circuit shown according to an embodiment of the invention.

FIG. 1 is a block diagram of a comparator testing circuit shown according to an embodiment of the invention. Please refer to FIG. 1, a comparator testing circuit 10 includes, but is not limited to, a switching circuit 110, a comparator 120, and a determination circuit 130. The comparator testing circuit 10 receives a first signal PX, a second signal NX, and a switching signal ALT. The comparator testing circuit 10 performs self-test on the comparator 120 according to the first signal PX, the second signal NX, and the switching signal ALT to determine whether the comparator 120 is abnormal, and generates an exception flag EF based on the determination result as the test result of the comparator testing circuit 10 for subsequent application.

The switching circuit 110 receives the first signal PX, the second signal NX, and the switching signal ALT. The switching circuit 110 outputs one of the first signal PX and the second signal NX as a first input signal IN1 and the other of the first signal PX and the second signal NX as a second input signal IN2 according to the switching signal ALT. In an embodiment, when the switching signal ALT is at a low logic level, the switching circuit 110 outputs the first signal PX as the first input signal IN1 to the non-inverting input terminal of the comparator 120, and outputs the second signal NX as the second input signal IN2 to the inverting input terminal of the comparator 120. When the switching signal ALT is at a high logic level, the switching circuit 110 outputs the first signal PX as the second input signal IN2 to the inverting input terminal of the comparator 120, and outputs the second signal NX as the first input signal IN1 to the non-inverting input terminal of the comparator 120. The logic level of the switching signal ALT is for illustration only, but is not limited thereto. In other words, the switching circuit 110 switches the first signal PX and the second signal NX provided to the two input terminals of the comparator 120 according to the transition state of the switching signal ALT. The implementation details of the switching operation in the switching circuit 110 are described in detail later.

The comparator 120 is coupled to the switching circuit 110, and the comparator 120 includes a non-inverting input terminal, an inverting input terminal, and an output terminal. The comparator 120 receives the first input signal IN1 from the non-inverting input terminal, and receives the second input signal IN2 from the inverting input terminal. The comparator 120 compares the first input signal IN1 with the second input signal IN2 to generate an output signal OUT. In an embodiment, the comparator 120 may be a voltage comparator formed by an operational amplifier, but is not limited thereto.

The determination circuit 130 is coupled to the switching circuit 110 and the comparator 120. The determination circuit 130 receives the switching signal ALT and the output signal OUT, determines whether the comparator 120 is abnormal based on the switching signal ALT and the output signal OUT, and generates the exception flag EF according to the determination result. The specific implementation details of the determination circuit 130 are described in detail later.

Figure 2:
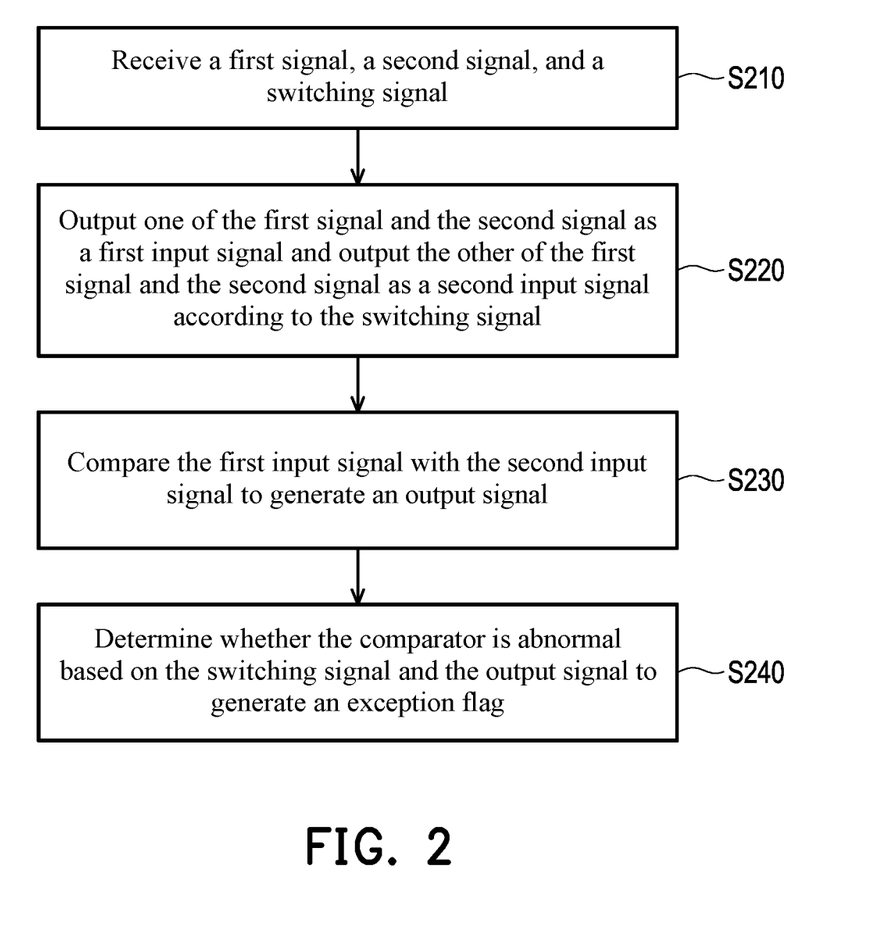
FIG. 2 is a flowchart of a testing method of a comparator testing circuit shown according to an embodiment of the invention.

FIG. 2 is a flowchart of a testing method of a comparator testing circuit shown according to an embodiment of the invention. Referring to FIG. 1 and FIG. 2, in step S210, the switching circuit 120 receives the first signal PX, the second signal NX, and the switching signal ALT. Next, in step S220, the switching circuit 110 outputs one of the first signal PX and the second signal NX as the first input signal IN1 and outputs the other of the first signal PX and the second signal NX as the second input signal IN2 according to the switching signal ALT. In step S230, the comparator 120 compares the first input signal IN1 with the second input signal IN2 to generate the output signal OUT. Next, in step S240, the determination circuit 130 determines whether the comparator 120 is abnormal based on the switching signal ALT and the output signal OUT, so as to generate the exception flag EF.

Figure 3:
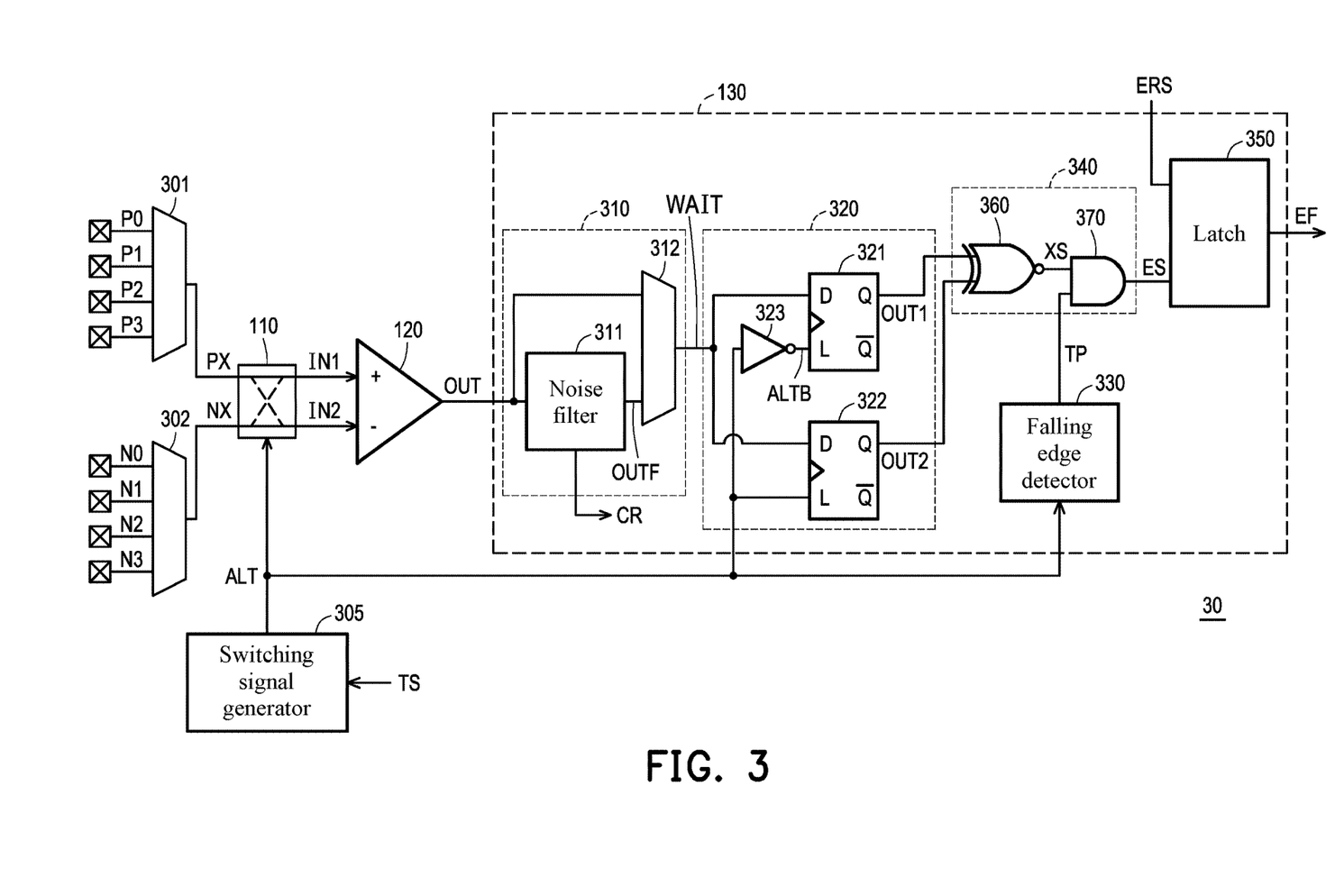
FIG. 3 is a circuit diagram of a comparator testing circuit shown according to an embodiment of the invention.

FIG. 3 is a circuit diagram of a comparator testing circuit shown according to an embodiment of the invention. Referring to FIG. 3, the comparator detector 30 includes, but is not limited to, a first multiplexer 301, a second multiplexer 302, a switching signal generator 305, the switching circuit 110, the comparator 120, and the determination circuit 130. The determination circuit 130 includes, but is not limited to, a signal processing circuit 310, a latch circuit 320, a falling edge detector 330, a logic circuit 340, and a latch 350.

The first multiplexer 301 is coupled to the switching circuit 110. The first multiplexer 301 receives a plurality of first original signals P0 to P3, selects one of the plurality of first original signals P0 to P3 as the first signal PX, and outputs the first signal PX to the switching circuit 110. The second multiplexer 302 receives a plurality of second original signals N0 to N3, selects one of the plurality of second original signals N0 to N3 as the second signal NX, and outputs the second signal NX to the switching circuit 110. It should be mentioned that, the comparator detector 30 includes the first multiplexer 301 and the second multiplexer 302 and provides the first signal PX and the second signal NX via the first multiplexer 301 and the second multiplexer 302, which is just an example. In other embodiments, the first signal PX and the second signal NX may also be provided by other signal sources outside the comparator detector 30 instead of being provided by the multiplexer. As shown in FIG. 1, the signal sources of the first signal PX and the second signal NX are not limited thereto.

The switching signal generator 305 is coupled to the switching circuit 110 and the determination circuit 130, and the switching signal generator 305 receives a trigger signal TS. The switching signal generator 305 generates the switching signal ALT according to the trigger signal TS, and provides the switching signal ALT to the switching circuit 110, the latch circuit 320, and the falling edge detector 330. In an embodiment, when the trigger signal TS is enabled, the switching signal generator 305 correspondingly enables the switching signal ALT. When the trigger signal TS is disabled, the switching signal ALT is also disabled accordingly. In an embodiment, the trigger signal TS may be provided by other elements of the comparator testing circuit, and may also be provided by a control unit (e.g., a processor, a controller, etc.) that controls the comparator testing circuit. The present embodiment does not limit the generation method of the trigger signal TS.

The switching circuit 110 includes a first input terminal, a second input terminal, a first output terminal, and a second output terminal. The first input terminal of the switching circuit 110 receives the first signal PX, the second input terminal of the switching circuit 110 receives the second signal NX, the first output terminal of the switching circuit 110 outputs the first input signal IN1, and the second output terminal outputs the second input signal IN2. In an embodiment, the switching circuit 110 may be a voltage-controlled switch, and the coupling relationship among the first input terminal, the second input terminal, the first output terminal, and the second output terminal of the switching circuit 110 is switched via the switching signal ALT, but is not limited thereto. For example, when the switching signal ALT is at a low logic level, the first input terminal of the switching circuit 110 is coupled to the first output terminal of the switching circuit 110, and the second input terminal of the switching circuit 110 is coupled to the second output terminal of the switching circuit 110. When the switching signal ALT is at a high logic level, the first input terminal of the switching circuit 110 is switched to be coupled to the second output terminal of the switching circuit 110, and the second input terminal of the switching circuit 110 is switched to be coupled to the first output terminal of the switching circuit 110.

The signal processing circuit 310 is coupled to the output terminal of the comparator 120. The signal processing circuit 310 receives the output signal OUT and performs signal processing on the output signal OUT to generate an output signal WAIT to be latched. The signal processing circuit 310 includes a noise filter 311 and a third multiplexer 312. The noise filter 311 is coupled to the output terminal of the comparator 120. The noise filter 311 includes a filter and a counter for filtering the output signal OUT to generate a filtered output signal OUTF, and counts a number of clock signals CR corresponding to the output signal OUT maintaining a certain logic level according to the clock signal (not shown). For example, the counter in the noise filter 311 may use the clock signal to count the number of clock signals CR corresponding to the time when the output signal OUT maintains a high logic level or a low logic level. For example, the number of clock signals corresponding to the time that the output signal OUT maintains the high logic level is 10, and the number of clock signals CR output by the noise filter 311 is 10. The third multiplexer 312 is coupled to the comparator 120 and the noise filter 311 and configured to select one of the output signal OUT and the filtered output signal OUTF as the output signal WAIT to be latched.

It should be mentioned that, regarding the number of clock signals CR, when the number of clock signals CR corresponding to the output signal OUT maintaining a specific logic value is greater than a predetermined threshold NTH, the switching signal ALT is enabled. For example, if the number of clock signals CR is 10 and the predetermined threshold NTH is 8, when an external processor (not shown) or other hardware circuit of the comparator detector 30 determines that the number of clock signals CR is greater than the predetermined threshold NTH, the processor or other hardware circuits provide the trigger signal TS to trigger the switching signal generator 305, thereby enabling the switching signal ALT. In an embodiment, the trigger signal TS and the switching signal ALT may both be pulse signals. The predetermined threshold is determined according to design requirements, but is not limited thereto. In other words, the number of clock signals CR may be used to determine whether the output signal OUT is stable at this time, so that it is suitable for self-test. When the number of clock signals CR is greater than the predetermined threshold NTH, the external processor or other hardware circuit may determine that the output signal OUT is stable at this time, which is suitable for self-test, so as to trigger the switching signal generator 305 by the trigger signal TS to enable the switching signal ALT. It must be noted that the above self-test timing determination is only a design option, and the trigger signal may also be obtained from other sources.

The latch circuit 320 is coupled to the signal processing circuit 310, and the latch circuit 320 receives the output signal WAIT to be latched and the switching signal ALT. The latch circuit 320 latches the output signal WAIT to be latched according to the switching signal ALT to generate a first output signal OUT1 and a second output signal OUT2. The latch circuit 320 includes an inverter 323, a first flip-flop 321, and a second flip-flop 322. The inverter 323 is coupled to the switching signal generator 305, and the inverter 323 inverts the switching signal ALT to generate an inverted switching signal ALTB. The first flip-flop 321 is coupled to the signal processing circuit 310 and the inverter 323. The first flip-flop 321 latches the output signal WAIT to be latched according to the inverted switching signal ALTB to generate the first output signal OUT1. The second flip-flop 322 is coupled to the signal processing circuit 310 and the switching signal generator 305. The second flip-flop 322 latches the output signal WAIT to be latched according to the switching signal ALT to generate the second output signal OUT2. The first flip-flop 321 and the second flip-flop 322 may be D-type flip-flops, and L in the first flip-flop 321 and the second flip-flop 322 is an enabling terminal, but not limited thereto.

Specifically, when the switching signal ALT is at a low logic level, the first flip-flop 321 is enabled to latch the output signal WAIT to be latched, thereby generating the first output signal OUT1. Moreover, when the switching signal ALT is at a high logic level, the second flip-flop 321 is enabled to latch the output signal WAIT to be latched, thereby generating the second output signal OUT2.

The falling edge detector 330 is coupled between the switching signal generator 305 and the logic circuit 340, and the falling edge detector 330 is used for detecting the falling edge of the switching signal ALT. When the falling edge detector 330 detects the falling edge of ALT, the falling edge detector 330 generates a falling edge pulse TP.

The logic circuit 340 is coupled to the latch circuit 320 and the falling edge detector 330. The logic circuit 340 receives the first output signal OUT1, the second output signal OUT2, and the falling edge pulse TP. The logic circuit 340 determines whether the comparator 120 is abnormal according to the first output signal OUT1, the second output signal OUT2, and the falling edge pulse TP to generate an exception determination signal ES. The logic circuit 340 includes an exclusive OR gate 360 and an AND gate 370. The exclusive OR gate 360 is coupled to the first flip-flop 321 and the second flip-flop 322. The exclusive OR gate 360 performs an exclusive OR (XOR) operation on the first output signal OUT1 and the second output signal OUT2 to generate an exclusive OR signal XS. The AND gate 370 is coupled to the exclusive OR gate 360 and the falling edge detector 330, and the gate 370 performs an AND operation on the exclusive OR signal XS and the falling edge pulse TP to generate the exception determination signal ES.

The latch 350 is coupled to the logic circuit 340. The latch 350 receives the exception determination signal ES and a clear signal ERS. The latch 350 latches the exception determination signal ES to generate the exception flag EF. Specifically, when the clear signal ERS is disabled, the latch 350 is enabled to latch the exception determination signal ES to generate the exception flag EF. Moreover, when the clear signal ERS is enabled, the latch 350 clears the exception flag EF (e.g., sets the exception flag EF to a low logic level). In an embodiment, the clear signal ERS may be provided by other elements of the comparator testing circuit, and may also be provided by a control unit (e.g., a processor, a controller, etc.) controlling the comparator testing circuit. The present embodiment does not limit the generation method of the clear signal ERS.

Figure 4A:
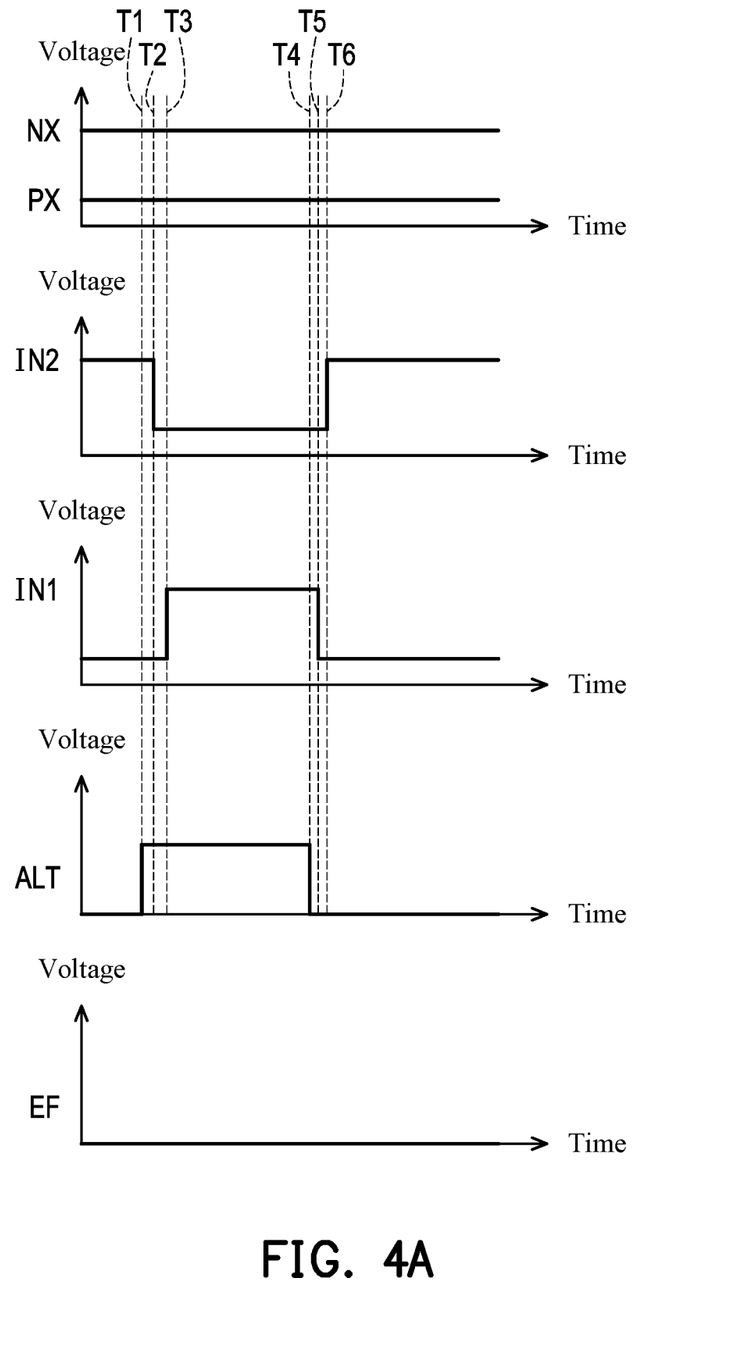
FIG. 4A is a timing diagram of a comparator testing circuit testing that a comparator is normal shown according to an embodiment of the invention.
Figure 4B:
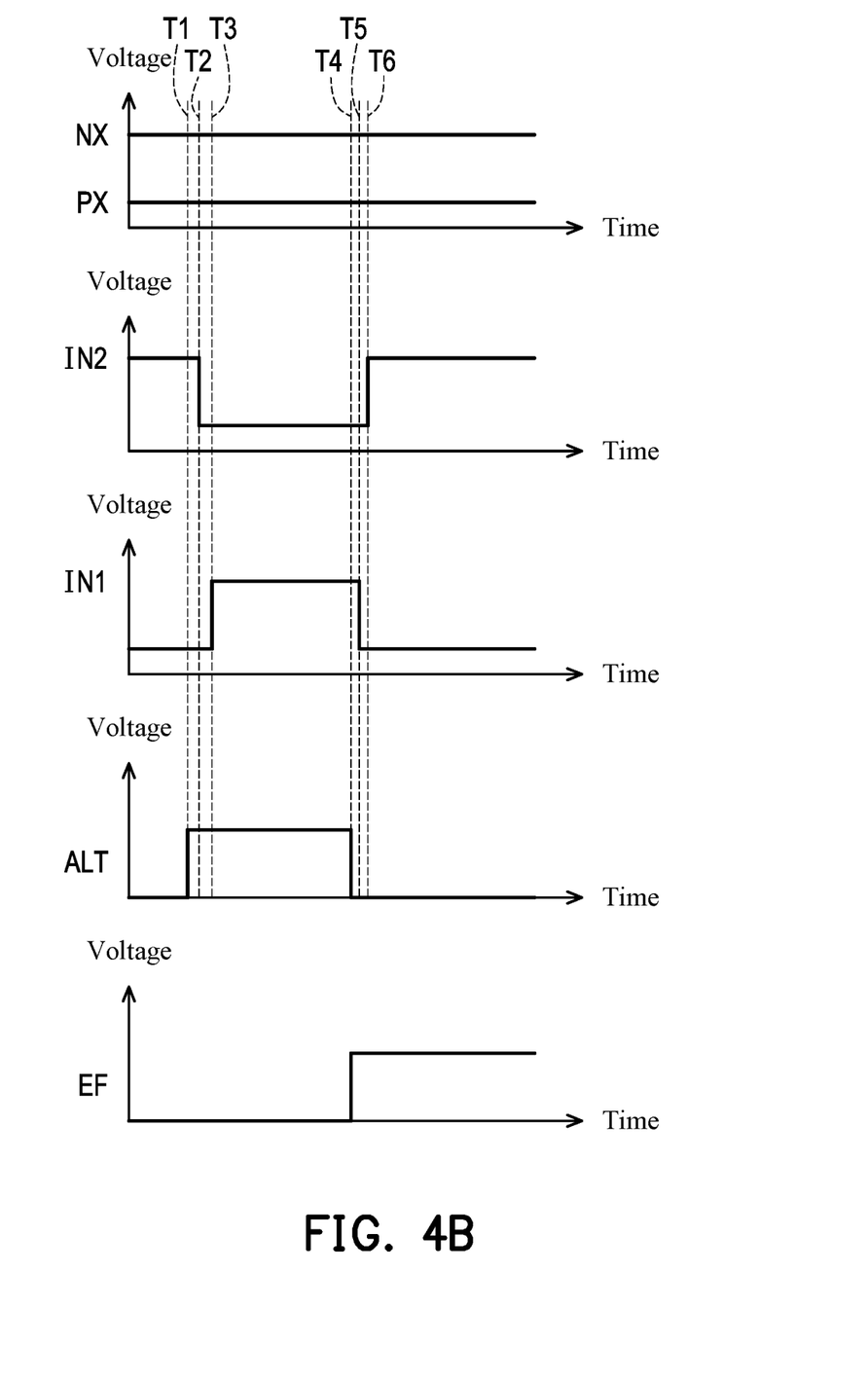
FIG. 4B is a timing diagram of a comparator testing circuit testing that a comparator is abnormal shown according to an embodiment of the invention.

FIG. 4A is a timing diagram of a comparator testing circuit testing that a comparator is normal shown according to an embodiment of the invention. FIG. 4B is a timing diagram of a comparator testing circuit testing that a comparator is abnormal shown according to an embodiment of the invention. Please refer to all of FIG. 3, FIG. 4A, and FIG. 4B.

Before time T1, the first signal PX is at a low logic level, the second signal NX is at a high logic level, and the switching signal ALT is at the low logic level. The switching circuit 110 outputs the first signal PX as the first input signal IN1 to the non-inverting input terminal of the comparator 120, and outputs the second signal NX as the second input signal IN2 to the inverting input terminal of the comparator 120. In the present embodiment, the first input signal IN1 is at the low logic level before time T1, and the second input signal IN2 is at the high logic level before time T1.

At time T1, the switching signal ALT is changed from the low logic level to the high logic level. The switching circuit 110 switches the coupling relationship between the input terminal and the output terminal thereof, and outputs the first signal PX as the second input signal IN2 to the inverting input terminal of the comparator 120, and outputs the second signal NX as the first input signal IN1 to the non-inverting input terminal of the comparator 120. Since the switching operation is delayed, and the switching delays of the first input signal IN1 and the second input signal IN2 are different, in the present embodiment, the second input signal IN2 is transitioned from the high logic level to the low logic level at time T2, and the first input signal IN1 is transitioned from the low logic level to the high logic level at time T3.

At time T4, the switching signal ALT is changed from the high logic level to the low logic level. The switching circuit 110 switches the coupling relationship between the input terminal and the output terminal thereof. The switching circuit 110 outputs the first signal PX as the first input signal IN1 to the inverting input terminal of the comparator 120, and outputs the second signal NX as the second input signal IN2 to the non-inverting input terminal of the comparator 120. Since the switching operation is delayed, and the switching delays of the first input signal IN1 and the second input signal IN2 are different, in the present embodiment, the first input signal IN1 is transitioned from the high logic level to the low logic level at time T5, and the second input signal IN2 is transitioned from the low logic level to the high logic level at time T6.

Moreover, when the falling edge detector 330 in the determination circuit 130 detects the falling edge of the switching signal ALT at time T4, the falling edge detector 330 generates the falling edge pulse TP to the logic circuit 340 in the determination circuit 130, so that the determination circuit 130 determines whether the logic levels of the first output signal OUT1 and the second output signal OUT2 received by the logic circuit 340 are different, thereby generating the exception flag EF. For example, in FIG. 4A, the comparator 120 has a normal comparator with a comparison function. Therefore, when the first input signal IN1 and the second input signal IN2 are switched, the logic levels of the first output signal OUT1 and the second output signal OUT2 need to be different. Therefore, the exception flag EF is kept at the low logic level, indicating that the comparator 120 is a normal comparator. Conversely, in FIG. 4B, the comparator 120 is an abnormal comparator with lost comparison function. When the first input signal IN1 and the second input signal IN2 are switched, the logic levels of the first output signal OUT1 and the second output signal OUT2 remain the same. Therefore, the exception flag EF is transitioned to the high logic level at time T4, indicating that the comparator 120 is abnormal. It should be mentioned that, the generation time of the exception flag EF is before the second transition time of the first input signal IN1 and the second input signal IN2, which may stagger the noise interference generated when the first input signal IN1 and the second input signal IN2 are switched.

Figure 5:
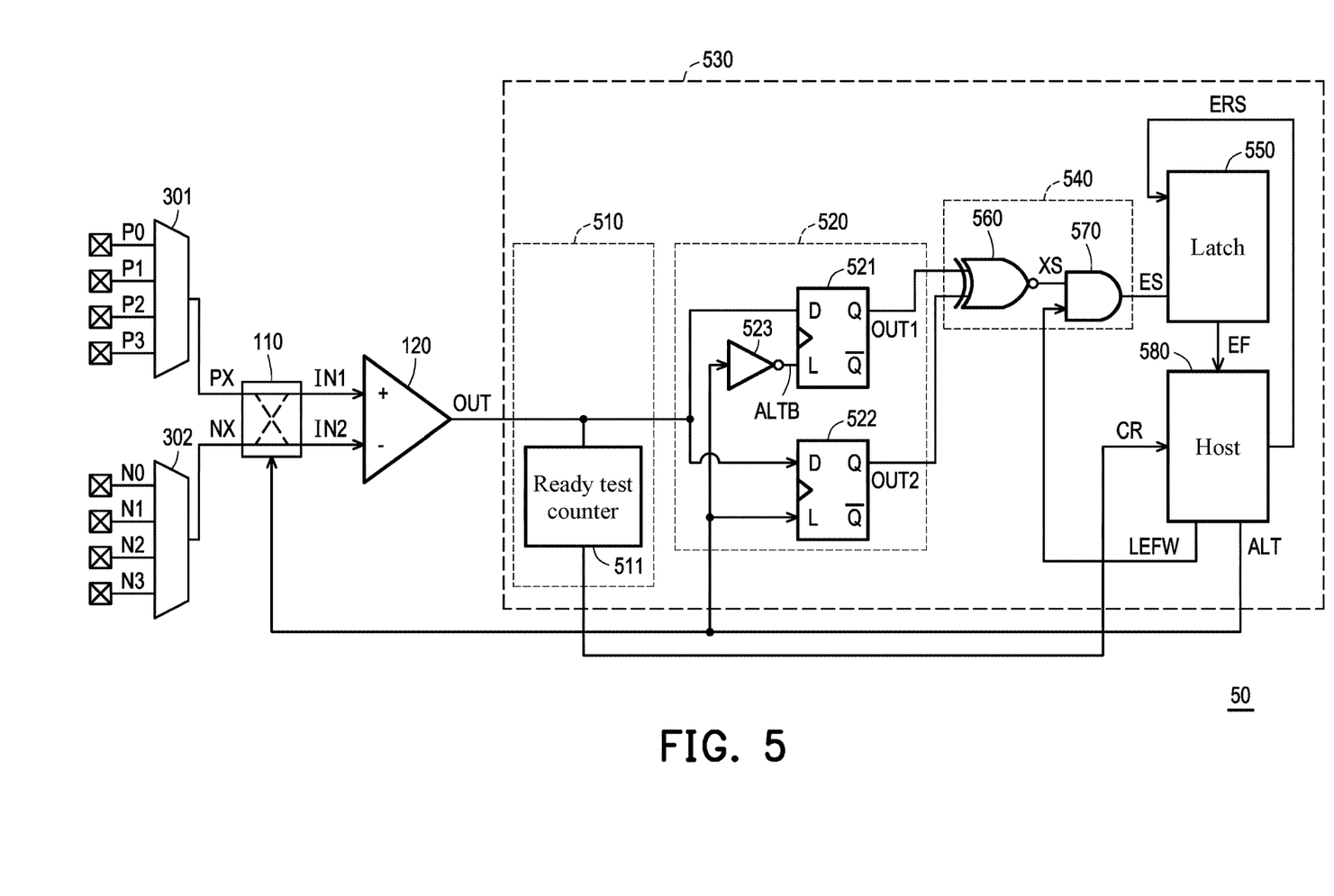
FIG. 5 is a circuit diagram of a comparator testing circuit shown according to another embodiment of the invention.

FIG. 5 is a circuit diagram of a comparator testing circuit shown according to another embodiment of the invention. Referring to FIG. 5, a comparator detector 50 includes, but is not limited to, the first multiplexer 301, the second multiplexer 302, the switching circuit 110, the comparator 120, and a determination circuit 530. The determination circuit 530 includes, but is not limited to, a signal processing circuit 510, a latch circuit 520, a logic circuit 540, a latch 550, and a host 580. The signal processing circuit 510 includes a ready test counter 511.

The difference between FIG. 5 and FIG. 3 is that the switching signal ALT of FIG. 5 is generated by the host 580. The host 580 generates a latch exception flag window pulse LEFW and the switching signal ALT according to the exception flag EF, and the number of clock signals CR. The host 580 provides the switching signal ALT to the switching circuit 110 and the latch circuit 520. The host 580 may also generate the clear signal ERS. When the clear signal ERS is enabled, the latch 350 clears the exception flag EF (e.g., sets the exception flag EF to the low logic level). In other embodiments consistent with the invention, the clear signal ERS may further be provided by other elements of the comparator testing circuit, and may also be provided by a control unit (e.g., a processor, a controller, etc.) that controls the comparator testing circuit. The present embodiment does not limit the generation method of the clear signal ERS. The implementation details of the host 580 are described in detail later. For the switching circuit 110 in FIG. 5, please refer to FIG. 3, and details are not repeated herein.

The signal processing circuit 510 is coupled to the output terminal of the comparator 120. The signal processing circuit 510 receives the output signal OUT and provides the output signal OUT to the latch circuit 520. The signal processing circuit 510 includes the ready test counter 511. The ready test counter 511 counts the number of clock signals CR corresponding to the output signal OUT maintaining a specific logic level according to a clock signal (not shown). For example, the ready test counter 511 may use the clock signal to count the number of clock signals CR corresponding to the time when the output signal OUT maintains the high logic level or the low logic level. For example, the number of clock signals corresponding to the time that the output signal OUT maintains the high logic level is 10, and the number of clock signals CR output by the ready test counter 511 is 10.

It should be mentioned that, regarding the number of clock signals CR, when the number of clock signals CR corresponding to the output signal OUT maintaining a specific logic value is greater than the predetermined threshold NTH, the host 580 enables the switching signal ALT. For example, if the number of clock signals CR is 10 and the predetermined threshold NTH is 8, when the comparator detector 50 determines via the host 580 having a processor or other hardware circuits that the number of clock signals CR is greater than the predetermined threshold NTH, the host 580 provides the enabled switching signal ALT. In an embodiment, the switching signal ALT may be a pulse signal. The predetermined threshold is determined according to design requirements, but is not limited thereto. In other words, the number of clock signals CR may be used to determine whether the output signal OUT is stable at this time, so that it is suitable for self-test. When the number of clock signals CR is greater than the predetermined threshold NTH, the host 580 may determine that the output signal OUT is stable and suitable for self-test, and enable the switching signal ALT. It must be noted that the self-test timing determination is only a design option, and the enabling of the switching signal ALT may also be performed in other ways.

The latch circuit 520 is coupled to the signal processing circuit 510, and the latch circuit 520 receives the output signal OUT and the switching signal ALT. The latch circuit 520 latches the output signal OUT according to the switching signal ALT to generate the first output signal OUT1 and the second output signal OUT2. The latch circuit 520 includes an inverter 523, a first flip-flop 521, and a second flip-flop 522. The inverter 523 is coupled to the host 580, and the inverter 523 inverts the switching signal ALT to generate the inverted switching signal ALTB. The first flip-flop 521 is coupled to the signal processing circuit 510 and the inverter 523. The first flip-flop 521 latches the output signal OUT according to the inverted switching signal ALTB to generate the first output signal OUT1. The second flip-flop 522 is coupled to the signal processing circuit 510 and the host 580. The second flip-flop 522 latches the output signal OUT according to the switching signal ALT to generate the second output signal OUT2. The first flip-flop 521 and the second flip-flop 522 may be D-type flip-flops, and L in the first flip-flop 521 and the second flip-flop 522 is an enabling terminal, but not limited thereto.

Specifically, when the switching signal ALT is at the low logic level, the first flip-flop 521 is enabled to latch the output signal OUT, thereby generating the first output signal OUT1. Moreover, when the switching signal ALT is at the high logic level, the second flip-flop 522 is enabled to latch the output signal OUT, thereby generating the second output signal OUT2.

The logic circuit 540 is coupled to the latch circuit 520 and the host 580. The logic circuit 540 receives the first output signal OUT1, the second output signal OUT2, and the latch exception flag window pulse LEFW. The logic circuit 540 determines whether the comparator 120 is abnormal according to the first output signal OUT1, the second output signal OUT2, and the latch exception flag window pulse LEFW to generate the exception determination signal ES. The logic circuit 540 includes an exclusive OR gate 560 and an AND gate 570. The exclusive OR gate 560 is coupled to the first flip-flop 521 and the second flip-flop 522. The exclusive OR gate 560 performs an exclusive OR (XOR) operation on the first output signal OUT1 and the second output signal OUT2 to generate the exclusive OR signal XS. The AND gate 570 is coupled to the exclusive OR gate 560 and the host 580, and the AND gate 570 performs an AND operation on the exclusive OR signal XS and the latch exception flag window pulse LEFW to generate the exception determination signal ES.

The latch 550 is coupled to the logic circuit 540, and the latch 550 receives the exception determination signal ES and the clear signal ERS. The latch 550 latches the exception determination signal ES to generate the exception flag EF. Specifically, when the clear signal ERS is disabled, the latch 550 is enabled to latch the exception determination signal ES to generate the exception flag EF. Moreover, when the clear signal ERS is enabled, the latch 550 clears the exception flag EF (e.g., sets the exception flag EF to the low logic level). In an embodiment, the clear signal ERS may be provided by other elements of the comparator testing circuit, and may also be provided by a control unit (e.g., a processor, a controller, etc.) controlling the comparator testing circuit. The present embodiment does not limit the generation method of the clear signal ERS.

The host 580 is coupled to the switching circuit 110, the signal processing circuit 510, the latch circuit 520, the logic circuit 540, and the latch 550. The host 580 receives the exception flag EF and the number of clock signals CR, the host 580 stores the number of clock signals CR in the register, and compares the number of clock signals CR with the predetermined threshold NTH to determine the timing of enabling the switching signal ALT. The determination method thereof is as shown in FIG. 3 and is not repeated herein. Moreover, after the host 580 generates the switching signal ALT, the host 580 may make the host 580 generate the exception flag window pulse LEFW at a specific time according to the internal setting in the comparator testing circuit. In this way, a short-term transient situation caused by the exclusive OR signal XS due to the switching circuit 110 being controlled by the switching signal ALT is avoided, so that the latch 550 may obtain the correct state of the exception determination signal ES. Those applying the present embodiment may use an element such as a register, a processor, a controller, etc., to record or store the internal settings, and let the host 580 actively or passively generate the exception flag window pulse LEFW at an appropriate time.

Figure 6A:
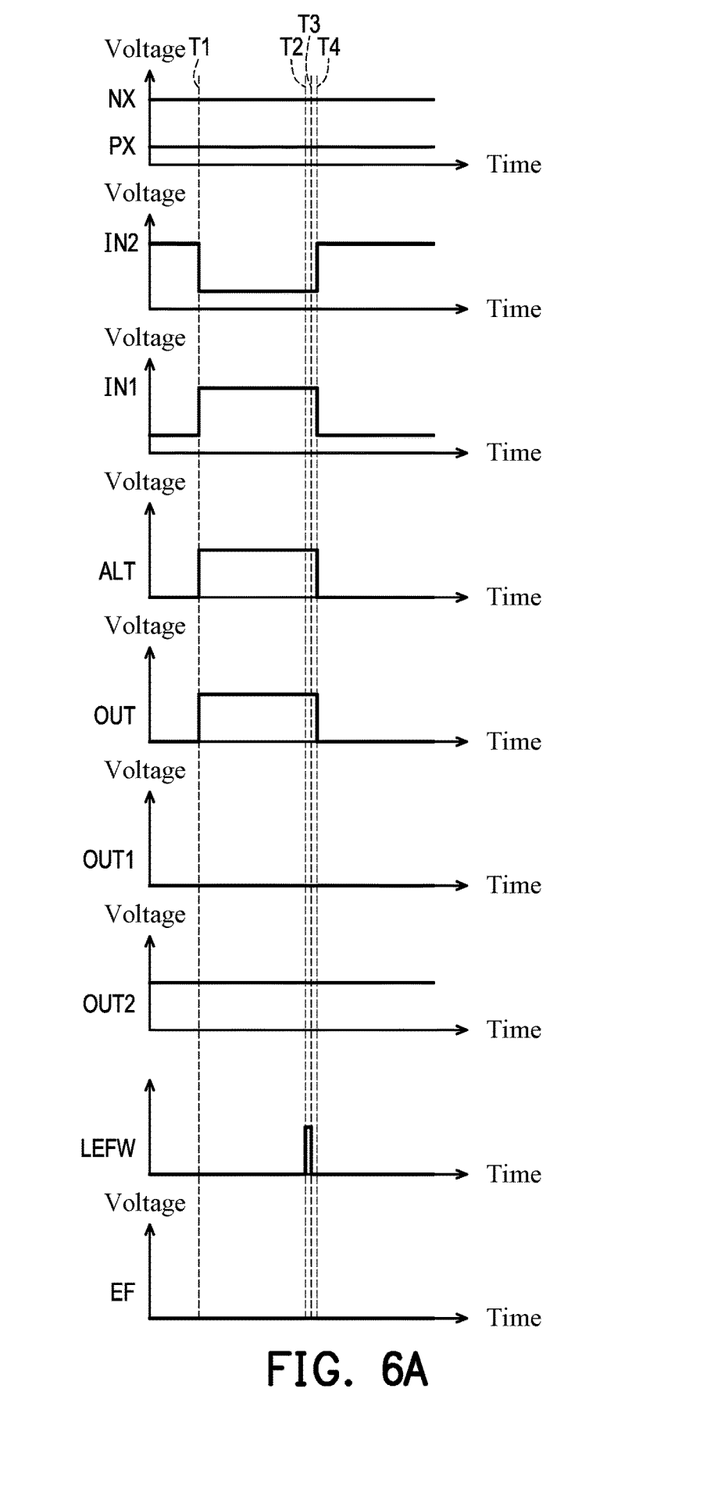
FIG. 6A is a timing diagram of a comparator testing circuit testing that a comparator is normal shown according to another embodiment of the invention.
Figure 6B:
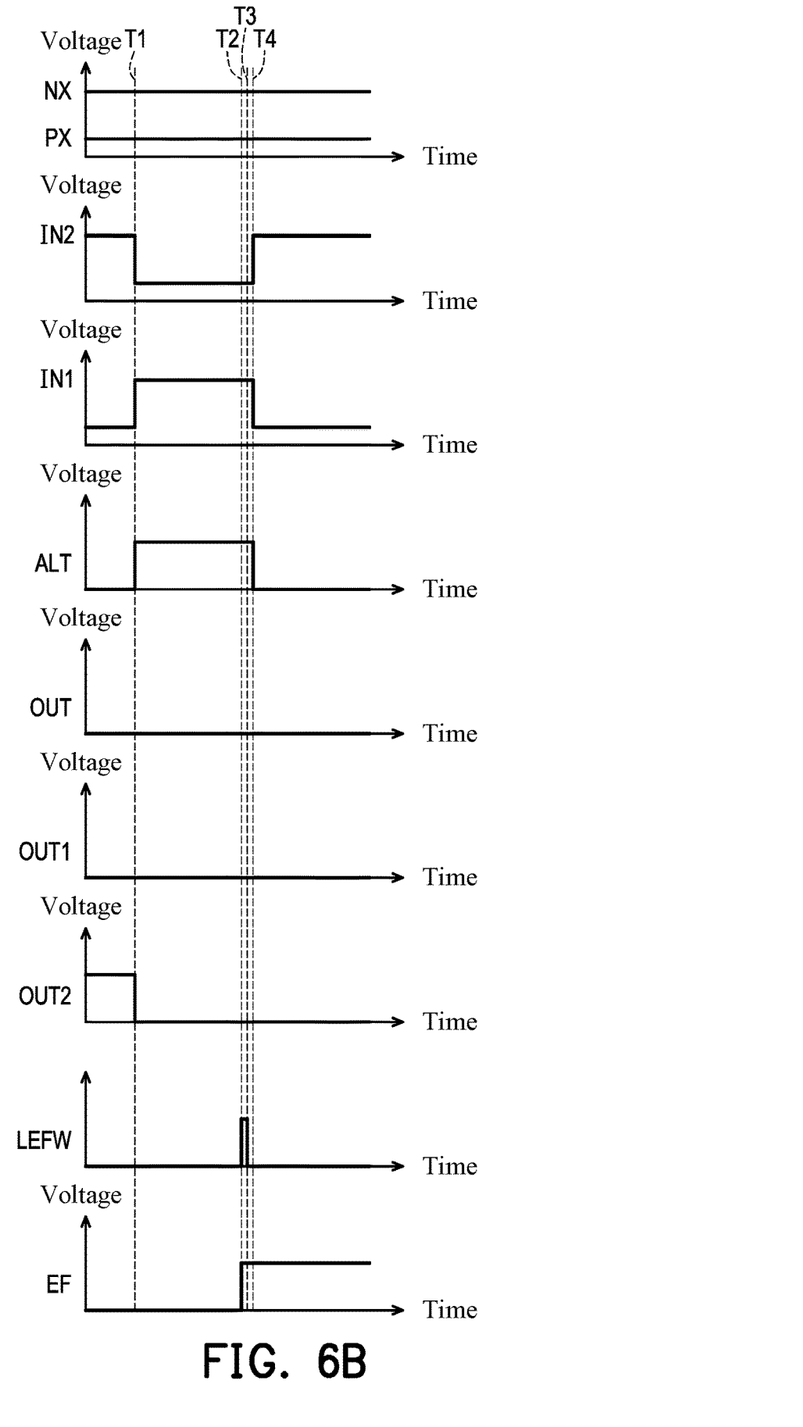
FIG. 6B is a timing diagram of a comparator testing circuit testing that a comparator is abnormal shown according to another embodiment of the invention.

FIG. 6A is a timing diagram of a comparator testing circuit testing that a comparator is normal shown according to another embodiment of the invention. FIG. 6B is a timing diagram of a comparator testing circuit testing that a comparator is abnormal shown according to another embodiment of the invention. Time sequence T1 in FIG. 6A and FIG. 6B corresponds to time sequences T1 to T3 of FIG. 4A and FIG. 4B, and time sequences T2 to T4 in FIG. 6A and FIG. 6B correspond to time sequences T4 to T6 of FIG. 4A and FIG. 4B. The time sequence operations thereof are similar. Please refer to the description of FIG. 4. The only difference is that the latch exception flag window pulse LEFW is introduced in FIG. 6A and FIG. 6B, and as described above, the transient condition generated by the exclusive OR signal XS due to switching may be avoided by latching the exception flag window pulse LEFW. It should be mentioned that, according to design requirements, the host 580 or the control unit controlling the comparator testing circuit may also clear the exception flag EF via the clear signal ERS at an appropriate time, but is not limited thereto.

Based on the above, in the invention, by exchanging the input signals of the two input terminals in the comparator, whether the output signal of the comparator is different before and after the input signal is exchanged is determined, so as to know whether the comparator is abnormal. Since the test result is provided at the falling edge of the switching signal, the noise interference generated when the analog input is exchanged may be effectively avoided, thereby increasing test accuracy. Moreover, since the comparator testing circuit may be completely implemented by a hardware circuit, self-test time may be shortened to avoid affecting system operations, and system reliability may be improved.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:
1. A comparator testing circuit, comprising:
   a switching circuit configured to receive a first signal, a second signal, and a switching signal, and output one of the first signal and the second signal as a first input signal and the other of the first signal and the second signal as a second input signal according to the switching signal;
   a comparator coupled to the switching circuit and configured to compare the first input signal with the second input signal to generate an output signal; and a determination circuit coupled to the switching circuit and the comparator and configured to determine whether the comparator is abnormal based on the switching signal and the output signal to generate an exception flag.

2. The comparator testing circuit of claim 1, wherein the comparator testing circuit further comprises:
a first multiplexer receiving a plurality of first original signals and selecting one of the plurality of first original signals as the first signal; and
a second multiplexer receiving a plurality of second original signals and selecting one of the plurality of second original signals as the second signal.

3. The comparator testing circuit of claim 1, wherein the switching circuit comprises a first input terminal, a second input terminal, a first output terminal, and a second output terminal, the first input terminal receives the first signal, the second input terminal receives the second signal, the first output terminal outputs the first input signal, and the second output terminal outputs the second input signal.

4. The comparator testing circuit of claim 3, wherein
when the switching signal is at a low logic level, the first input terminal is coupled to the first output terminal and the second input terminal is coupled to the second output terminal,
when the switching signal is at a high logic level, the first input terminal is coupled to the second output terminal and the second input terminal is coupled to the first output terminal.

5. The comparator testing circuit of claim 1, wherein the determination circuit comprises:
a signal processing circuit coupled to the comparator and configured to perform a signal processing on the output signal to generate an output signal to be latched;
a latch circuit coupled to the signal processing circuit and configured to latch the output signal to be latched according to the switching signal to generate a first output signal and a second output signal;
a falling edge detector, wherein the falling edge detector detects a falling edge of the switching signal to generate a falling edge pulse;
a logic circuit coupled to the latch circuit and the falling edge detector and configured to determine whether the comparator is abnormal according to the first output signal, the second output signal, and the falling edge pulse to generate an exception determination signal; and
a latch coupled to the logic circuit and configured to latch the exception determination signal to generate the exception flag.

6. The comparator testing circuit of claim 5, wherein when the switching signal is transitioned from a high logic level to a low logic level, and the determination circuit determines whether logic levels of the first output signal and the second output signal are different.

7. The comparator testing circuit of claim 6, wherein
when the switching signal is transitioned from the high logic level to the low logic level and when the determination circuit determines that logic levels of the first output signal and the second output signal are different, the determination circuit determines that the comparator is normal,
when the switching signal is transitioned from the high logic level to the low logic level and when the determination circuit determines that the logic levels of the first output signal and the second output signal are the same, the determination circuit determines that the comparator is abnormal.

8. The comparator testing circuit of claim 5, wherein the signal processing circuit comprises:
a noise filter coupled to the comparator and configured to filter the output signal to generate a filtered output signal, and to count a number of clock signals corresponding to the output signal maintaining a certain logic level according to a clock signal; and
a third multiplexer coupled to the comparator and the noise filter and configured to select one of the output signal and the filtered output signal as the output signal to be latched.

9. The comparator testing circuit of claim 8, wherein the signal processing circuit further comprises a switching signal generator, the switching signal generator generates the switching signal according to the trigger signal, wherein the switching signal is enabled when the number of clock signals corresponding to the output signal maintaining the certain logic level is greater than the predetermined threshold.

10. The comparator testing circuit of claim 5, wherein the latch circuit comprises:
an inverter configured to invert the switching signal to generate an inverted switching signal;
a first flip-flop coupled to the signal processing circuit and the inverter and configured to latch the output signal to be latched according to the inverted switching signal to generate the first output signal; and
a second flip-flop coupled to the signal processing circuit and configured to latch the output signal to be latched according to the switching signal to generate the second output signal.

11. The comparator testing circuit of claim 10, wherein
when the switching signal is at a low logic level, the first flip-flop is enabled to latch the output signal to be latched, to generate the first output signal,
when the switching signal is at a high logic level, the second flip-flop is enabled to latch the output signal to be latched to generate the second output signal.

12. The comparator testing circuit of claim 5, wherein the logic circuit comprises:
an exclusive OR gate coupled to the first flip-flop and the second flip-flop and configured to perform an exclusive OR operation on the first output signal and the second output signal to generate an exclusive OR signal; and
an AND gate coupled to the exclusive OR gate and the falling edge detector and configured to perform an AND operation on the exclusive OR signal and the falling edge pulse to generate the exception determination signal.

13. The comparator testing circuit of claim 1, wherein the determination circuit comprises:
a signal processing circuit coupled to the comparator for providing an output signal;
a latch circuit coupled to the signal processing circuit and configured to latch the output signal according to the switching signal to generate a first output signal and a second output signal;
a logic circuit coupled to the latch circuit and configured to determine whether the comparator is abnormal according to the first output signal, the second output signal, and a latch exception flag window pulse to generate an abnormal determination signal;

a latch coupled to the logic circuit and configured to latch the exception determination signal to generate the exception flag; and a host coupled to the switching circuit, the signal processing circuit, the latch circuit, the logic circuit, and the latch, wherein the host generates the latch exception flag window pulse and the switching signal according to the exception flag, and a number of clock signals corresponding to the output signal.

14. The comparator testing circuit of claim 13, wherein the signal processing circuit comprises a ready test counter, the ready test counter counts the number of clock signals corresponding to the output signal maintaining a specific logic level according to a clock signal.

15. The comparator testing circuit of claim 14, wherein the host generates the switching signal according to the number of clock signals, wherein the switching signal is enabled when the number of clock signals corresponding to the output signal maintaining the certain logic level is greater than the predetermined threshold.

16. The comparator testing circuit of claim 13, wherein the logic circuit comprises:

an exclusive OR gate coupled to the first flip-flop and the second flip-flop and configured to perform an exclusive OR operation on the first output signal and the second output signal to generate an exclusive OR signal; and an AND gate coupled to the exclusive OR gate and the host and configured to perform an AND operation on the exclusive OR signal and the latch exception flag window pulse to generate the exception determination signal.

17. A testing method, adapted for a comparator testing circuit, wherein the comparator testing circuit comprises a switching circuit, a comparator, and a determination circuit, the testing method comprising:

receiving a first signal, a second signal, and a switching signal, and outputting one of the first signal and the second signal as a first input signal and the other of the first signal and the second signal as a second input signal according to the switching signal via a switching circuit;

generating an output signal by comparing the first input signal with the second input signal via the comparator; and determining whether the comparator is abnormal based on the switching signal and the output signal via the determination circuit to generate an exception flag.

18. The testing method of claim 17, wherein the step of determining whether the comparator is abnormal based on the switching signal and the output signal via the determination circuit to generate the exception flag comprises:

performing a signal processing on the output signal to generate an output signal to be latched;

latching the output signal to be latched to generate a first output signal and a second output signal;

detecting a falling edge of the switching signal to generate a falling edge pulse;

determining whether the comparator is abnormal according to the first output signal, the second output signal, and the falling edge pulse to generate an exception determination signal; and latching the exception determination signal to generate the exception flag.

19. The testing method of claim 18, wherein the step of determining whether logic levels of the first output signal and the second output signal received by the logic circuit 340 are different, wherein when the switching signal is transitioned from the high logic level to the low logic level and when logic levels of the first output signal and the second output signal are different, determining that the comparator is normal, when the switching signal is transitioned from the high logic level to the low logic level and when the logic levels of the first output signal and the second output signal are the same, determining that the comparator is abnormal.

20. The testing method of claim 17, wherein the step of determining whether the comparator is abnormal based on the switching signal and the output signal via the determination circuit to generate an exception flag comprises:

counting a number of clock signals corresponding to the output signal maintaining a certain logic level according to a clock signal;

latching the output signal to generate a first output signal and a second output signal;

determining whether the comparator is abnormal according to the first output signal, the second output signal, and the falling edge pulse to generate an exception determination signal;

latching the exception determination signal to generate the exception flag; and generating the latch exception flag window pulse and the switching signal according to the exception flag, the first output signal, and the number of clock signals.

* * * * *